United States Patent
Grunwald

(10) Patent No.: US 6,896,710 B2
(45) Date of Patent: May 24, 2005

(54) ABRASIVES FOR CMP APPLICATIONS

(75) Inventor: John Grunwald, Ramat-Gan (IL)

(73) Assignee: J.G. Systems, Inc., Miami, FL (US)

(*) Notice: Subject to any disclaimer, the term of this patent is extended or adjusted under 35 U.S.C. 154(b) by 0 days.

(21) Appl. No.: 10/678,879

(22) Filed: Oct. 3, 2003

(65) Prior Publication Data

US 2005/0044801 A1 Mar. 3, 2005

(30) Foreign Application Priority Data

Sep. 1, 2003 (IL) .................................................. 157681

(51) Int. Cl.⁷ ............................ C09G 1/02; C09G 1/04
(52) U.S. Cl. ............................ 51/307; 51/308; 51/309; 106/3
(58) Field of Search ..................... 51/307, 308, 309, 51/298; 106/3; 438/692, 693

(56) References Cited

U.S. PATENT DOCUMENTS

| 3,525,600 | A | * | 8/1970 | Yoshikawa et al. ........... 51/295 |
| 5,453,329 | A | * | 9/1995 | Everett et al. ............... 428/565 |
| 6,270,395 | B1 | * | 8/2001 | Towery et al. ................. 451/41 |
| 6,447,694 | B1 | * | 9/2002 | Lee et al. ................... 252/79.1 |
| 6,537,144 | B1 | | 3/2003 | Tsai et al. |
| 6,582,623 | B1 | | 6/2003 | Grumbine et al. |
| 6,592,776 | B1 | | 7/2003 | Wang et al. |
| 6,743,267 | B2 | * | 6/2004 | Jernakoff et al. ............. 51/307 |
| 2001/0002356 | A1 | * | 5/2001 | Andrews et al. ............... 451/41 |
| 2003/0162398 | A1 | * | 8/2003 | Small et al. ................. 438/692 |
| 2004/0137834 | A1 | * | 7/2004 | Webb et al. ................. 451/526 |

* cited by examiner

*Primary Examiner*—Michael Marcheschi
(74) *Attorney, Agent, or Firm*—Carmody & Torrance LLP

(57) ABSTRACT

The present invention provides a novel, structurally improved, abrasive agent, with improved surface properties resulting, inter alia, in enhanced wettability, dispersability and bonding. More specifically, the present invention provides according to an aspect thereof, an abrasive agent comprising abrasive particles, said particles being in the form of a composite material comprising more than one metal oxide material. In another aspect, the present invention provides an abrasive agent comprising metal oxide abrasive particles, said particles being coated at least partially with an extraneous metal or metal bearing layer.

4 Claims, No Drawings

ABRASIVES FOR CMP APPLICATIONS

FIELD OF THE INVENTION

This invention relates to wafer planarizing chemical mechanical polishing (CMP) systems.

BACKGROUND OF THE INVENTION

The quest for ever greater miniaturization of electronic interconnect devices imposes stringent and challenging processing standards in general, and in particular in the areas of wafer flatness or planarity. The challenge stems, inter alia, from the multitude of differing metals/materials used at the various levels. Specifically, copper which is greatly favored as interconnect metal because of its attractive electrical conductivity and low cost, presents special planarity challenges, due to its chemical reactivity that makes it prone to oxidation/erosion, believed by many to be the cause of dishing.

To achieve optimum planarization, the industry increasingly relies on mechanical chemical polishing (CMP) at each manufacturing level.

Broadly, there are two types of CMP processes:

A. Slurry-based CMP compositions, wherein abrasive particles along with other ingredients are dispersed in aqueous/solvent media, and are delivered onto a pad, typically made of polyurethane or polyurethane composites. The surface to be planarized is rubbing against the rotating pad resulting in a leveling action via removal of protruding/uneven matter.

B. Fixed abrasive pads, wherein abrasive particles are embedded in the polishing pad. Fixed polishing systems are gaining popularity because they lead to better planarity. Also, fixed abrasive systems generate less waste, as they do not require delivery of extraneous slurry.

Abrasive materials utilized both in slurry suspensions and fixed abrasive pads, are typically a blend of particulate metal oxide particles, generally selected from the group of oxides of silicon, cerium, aluminum, titanium, and others.

Slurry-based systems present difficulties, some of which are:

1. The slurry suspensions are prone to stratification/settling that tends to make the suspension non-homogeneous and unstable that can lead to uneven, non uniform slurry delivery, resulting in uneven planarity. This is caused at least in part, by the multiplicity of metal oxide particles in the slurry blend, with each metal oxide having individual and potentially dissimilar surface properties.
2. Slurry particles tend to "stick" to the polished wafer, leading to particulate surface contamination, that makes the wafer difficult to clean satisfactorily.
3. Spent or waste slurry particles can clog the grooves of the polishing pads, again resulting in uneven slurry delivery and unsatisfactory planarization.

Referring to fixed-abrasive pad systems, they tend to yield improved planarity, compared to slurry-based systems, but because of the hydrophobic nature of the abrasives embedded in the polymer matrix, are often prone to poor wettability.

The prior art recognizes the need for improved abrasive particles, to better serve the industry's challenging needs. This need is reflected in part by U.S. Pat. No. 6,582,623 to Grumbine and U.S. Pat. No. 6,592,776 to Wang, that are indicative of the more recent prior art. They disclose abrasives that are "surface-modified" via organic silanes, and/or via nitrogen-containing compounds, such as benzotriazole (referred to as "film-forming agents"), and at least one silane compound. The thus surface-modified abrasives are reported to afford tailoring a given polishing composition for a specific task, to achieve a desired polishing rate, to suit the nature of material to be polished, etc. The surface-modified abrasives are also said to reduce agglomeration and settling of the slurry dispersions. Surface modifiers are contained in a solvent which, when added to the dispersion leads to the bonding of the surface-modifying moiety to the abrasive particle.

SUMMARY OF THE INVENTION

The present invention provides a novel, structurally improved, abrasive agent, hereinafter called interchangeably: particle, unit, composite or grain, with advantageous overall properties, comprising improved surface properties resulting, inter alia, in enhanced wettability, dispersability and bonding.

The invention will be disclosed mainly by the following aspects:

1. An abrasive particle that consists of a single structure comprising more than one metal oxide, e.g. a grain that is constructed of at least two metal oxides, for example $SiO_2$ and $Al_2O_3$.
2. An abrasive agent that consists of metal oxide particles coated at least partially with an extraneous metal or metal bearing layer.
3. Abrasive agents that consist of abrasive particles comprising more than one metal oxide and are coated at least partially with an extraneous metal or metal bearing layer are also within the scope of the present invention.

While the novel particle of this invention is of particular interest in the field of chemical-mechanical polishing, it potentially can be embodied for polishing of metals and non-metals in general, for manufacturing cutting tools, industrial coatings, and a host of others.

The abrasive agent of the invention comprises particles that produce more uniform, more stable dispersions, when compounded into a CMP slurry. The agent also reduces metal erosion, and alleviates copper dishing.

The abrasive agent of the invention further leads to improved, more durable fixed-abrasive pads, with potentially reduced scratching. This can be mainly attributed to improved adhesion of the abrasive particles in the polymer binder.

Another advantage of the abrasive agent of the invention is that it minimizes the problem of spent slurry particles depositing on the wafer surface, hindering wafer cleanliness and wafer cleanability.

According to one aspect, the above, as well as other improvements are provided by coating the abrasive particles at least partially with a metallic or metal bearing layer, prior to their use in CMP slurries, or prior to their inclusion into fixed-abrasive pads. The metallic layer can be achieved by any one of numerous existing coating processes, such as vapor—phase metallization, flame, plasma, electroless deposition from aqueous systems, and a host of other methods.

Also, the invention contemplates the metal bearing substance that is deposited onto or into the abrasive particle to be preferably different than the metal component constituting the "body" or "core" of the metal oxide particle or grain, upon which the metal or metal oxide is deposited on.

According to another aspect of the invention, the abrasive agent consists of particles that are composites containing two or more metallic oxides on, or in, the same particle, as opposed to particles consisting of a single metal oxide, that is generally practiced by the prior art. Such composite particles may be obtained via gaseous compositions. An abrasive particle or grain, that is a composite of multiple oxides of differing metals, will lead to polishing benefits. As an example, the invention contemplates abrasive particle composites of $SiO_2$ and $TiO_2$ on the same grain.

DETAILED DESCRIPTION OF THE INVENTION

As mentioned above, the general concept of one aspect of the present invention focuses on increasing the surface energy of abrasive particles or grains by enveloping them, partially or completely, with a metallic layer or film. In this application, the terms "layer", "film" and "coating" are used interchangeably. Also, the term "partially covered", is understood in this invention to cover partial coverage of the abrasive particles with a layer of material, as well as spotty, "patchy" coverage of the abrasive particles. Such patchy coverage by the metal bearing layer can be as little as a small fraction of the total particle surface.

As to the term "completely covered", it implies in this invention to denote at least a 50% coverage of particle area exposed to metallization.

The thus metallized, metal-coated grain results in a novel abrasive particle entity, leading to a multitude of advantages, some of which have been mentioned previously.

It is envisioned that the statistical distribution of the coated abrasive particles will by necessity encompass a broad and varying range of surface coverage, i.e. particles that are partially covered, as well as particles that are completely covered, affording an abrasive blend with adjustable properties, ranging from properties of essentially uncoated abrasives, to properties of essentially metal-covered particles, and properties that are "in-between".

Metallic or metal bearing coatings or films, as used in this invention, include metals or metalloids at zero valence state, and/or metal oxides, metal hydroxides, water-insoluble metal compounds in general, as well as mixtures thereof. Also, above metallic coatings will be less than "pure", as it is often impractical to industrially produce metal bearing films that are devoid of impurities.

The metal-bearing layer comprises at least one metal selected from the group consisting of Cu, Ti, Fe, Sn, Pb, Ta, Mo, Wo and Nb.

It is further noted that certain preferred embodiments of the invention will be best served with coatings of metals at zero valence state, yet other preferred embodiments will opt for coatings of metal oxides, hydroxides, and the like, or mixtures thereof.

Referring to the thickness of metal-bearing films or layers, they can cover a very broad range, from a monolayer to several Angstroms. As to the upper thickness limit of the metal bearing substance, it will generally not exceed the size or diameter of the grain itself. The choice will be guided by the desired function of the coating or film. For example, while the surface energy of the coated particles can be enhanced, and wettability/adhesion to a binder improved, with films or coatings whose thickness is in the monolayer range, impacting the mechanical, chemical characteristics of the coated abrasive may require layer thicknesses of several Angstroms or small fractions of microns.

Depending on the nature of the metal in the metallic coating, the layer covering the abrasive particles will undergo chemical attack when exposed to the slurry suspension. The invention therefore envisions recycling, remetallizing and recoating abrasives as needed. Also, the invention further contemplates the use of alloy coatings, with the composition of the alloy being optimized for a given process, taking into consideration resistance to chemical attack by the slurry, and the principal function of the proposed layer, i.e. whether mechanical, chemical, etc. For the sole purpose of illustration, one would consider minimization of dishing to be a chemical or galvanic function, whereas reduction of scratching is viewed as a mechanical function.

In a further embodiment of the invention, one may opt for slurry suspensions that are binary mixtures, combining unmetallized abrasives with metalized abrasives, i.e. abrasives with altered outer surfaces covered with metallic or metal bearing layers.

In a still further embodiment, the above aforementioned binary slurry suspension will comprise particles of metal powders/particles, or particles of metal oxide powders. This, to accentuate a desired chemical or mechanical effect, over and above what is imparted by the coated abrasive.

The present invention further foresees combining metallized or metal coated abrasives with an organic layer. The organic layer or film can precede the metallic layer or top it. Examples of such potential organic layers or films are disclosed in U.S. Pat. No. 6,582,623 B 1, herein incorporated by reference.

One skilled in the art will have at his disposal numerous techniques for covering the grain with metal bearing layer or layers. Broadly, though not limitingly, such techniques will involve deposition of the film from gaseous environments, or from aqueous/semi aqueous compositions, with the latter often considered a preferred embodiment, as being more throughput-friendly. For example, deposition of the metallic layer from colloidal compositions is deemed a particularly attractive embodiment, because they can also serve to redeposit the metallic or metal bearing layers as they become depleted in use.

The present invention additionally envisions incorporation of metal-bearing colloids into the slurry suspensions themselves, with the continuous, in-situ forming/reforming of the films over the abrasive particles, as well as film formation over the surface to be polished or planarized. it is noted, for greater emphasis and clarification, that in such instances the colloid can be added to the slurry fluid at any stage of the polishing operation, i.e. at the beginning of the polishing operation, when the slurry fluid is made up initially, or the colloid can be added to the slurry composition intermittently in the course of the polishing operation, as needed. Of special interest (though not limitingly), will be polishing slurry compositions comprising tin, or copper-bearing colloids. Indeed, embodiments of polishing slurry compositions comprising such colloids, will reduce metal dishing, by forming a protective film over the surface to be polished, thereby reducing galvanic attack, that is thought to cause erosion, that leads to dishing.

The choice of such colloids will have to be guided by their compatibility with the slurry environment, especially as to the pH of the latter. GB # 417340, # 792624, 713211 to Johnson, and WO 0155092 to Rhodia, disclose colloids that can be helpful.

When opting for colloidal, preferably aqueous or semi-aqueous colloidal suspensions, as a means to coat or recoat the abrasive particles with the desired metallic layer, one skilled in the art will generally expose the abrasives to be coated via the colloidal suspension, with accompanying energetic agitation/stirring of the to-be-coated abrasive particles, while contacted with the colloid. This can be followed by draining, water rinsing, and drying of the coated abrasives. Drying the coated abrasives is generally desirable before they can be incorporated into fixed-abrasive pad binders.

Furthermore, when copper is the metallic layer of choice, the abrasives can be contacted with an aq. cupric copper solution that comprises chemical reducing agents yielding copper metal, cuprous hydroxide, or mixtures thereof. Spent copper waste solutions will be of special interest, because of economic and environmental considerations. Specifically, and illustratively, spent etchants with their high concentrations of cupric ammonium chlorides and carbonates can be advantageously and economically used to coat or recoat abrasives with copper-bearing layers. It is noted that the prior art considers copper dishing a phenomenon of copper erosion by the polishing fluid, and U.S. Pat. No. 6,537,144 proposes the presence of copper metal on the polishing pad to minimize dishing. "Copperized" abrasives of this invention will eminently serve this purpose.

What is claimed is:

1. A chemical mechanical polishing composition comprising metal oxide abrasive particles, said particles being coated at least partially with an extraneous metal layer, wherein the metal layer comprises a metal in its zero valence state, and wherein the metal layer also comprises a material selected from the group consisting of metal oxides, metal hydroxides, water-insoluble metal compounds, and mixtures of the foregoing.

2. The composition of claim 1 wherein the metal layer comprises at least one metal selected from the group consisting of Cu, Ti, Fe, Sn, Pb, Ta, Mo, and Nb.

3. The composition of claim 1 wherein the metal layer comprises copper in its zero valence state.

4. The composition according to claim 1 wherein the composition also comprises abrasive particles which are not coated with a metal layer.

* * * * *